United States Patent

Chao et al.

[11] Patent Number: 6,037,190
[45] Date of Patent: Mar. 14, 2000

[54] METHOD FOR FABRICATING AN ORGANIC ELECTRO-LUMINESCENT DEVICE

[75] Inventors: Ching-Ian Chao, Chutung; Chun-Hsun Chu, Chiai; Dao-Yang Huang; Heng-Long Yang, both of Taipei Hsien; Jui-Fen Pai, Nantou; Rung-Ywan Tsai, Kaohsiung; Fang-Chuan Ho, Hsinchu, all of Taiwan

[73] Assignee: Industrial Technology Research Institute, Hsinchu, Taiwan

[21] Appl. No.: 09/191,804

[22] Filed: Nov. 13, 1998

[51] Int. Cl.7 .............................. H01L 21/00; H01L 51/40
[52] U.S. Cl. .................................. 438/35; 438/99
[58] Field of Search .................. 438/22, 34, 35, 438/99, 795, 956; 257/40, 88, 89; 313/503, 504

[56] References Cited

U.S. PATENT DOCUMENTS

| | | |
|---|---|---|
| 5,408,109 | 4/1995 | Heeger et al. . |
| 5,641,611 | 6/1997 | Shieh et al. . |
| 5,663,573 | 9/1997 | Epstein et al. . |
| 5,681,756 | 10/1997 | Norman et al. . |
| 5,693,962 | 12/1997 | Shi et al. . |
| 5,757,026 | 5/1998 | Forrest et al. . |

*Primary Examiner*—Charles Bowers
*Assistant Examiner*—Keith Christianson
*Attorney, Agent, or Firm*—J.C. Patents; Jiawei Huang

[57] ABSTRACT

A method for fabricating a full-color organic electro-luminescent device starts with forming an indium tin oxide (ITO) layer on a glass substrate, and then forming a blue-light emitting layer on the ITO layer. By irradiating predetermined portions of the blue-light emitting layer with certain light sources, pixels that emit different light colors are formed on the irradiated portions of the blue-light emitting layer. An electrode layer is then formed on the corresponding pixels, wherein the electrode layer is further covered by a protection layer. During the operation of the full-color OEL device of the invention, a driving voltage is applied on the ITO layer, the anode, and the electrode layer, the cathode.

17 Claims, 9 Drawing Sheets

METHOD FOR FABRICATING AN ORGANIC ELECTRO-LUMINESCENT DEVICE

CROSS-REFERENCE TO RELATED APPLICATION

This application claims the priority benefit of Taiwan application serial no. 87117946, filed Oct. 29, 1998, the full disclosure of which is incorporated herein by reference.

BACKGROUND OF THE INVENTION

1. Field of the Invention

This invention relates to a fabrication process of an electro-luminescent device, and more particularly, to a fabrication process of a full-color organic electro-luminescent (OEL) device.

2. Description of Related Art

The organic electro-luminescent technique, which basically applies a high voltage on particular organic compounds, was originally introduced in 1963. Since the intensity of luminescence was far below the practical level, research on developing more practicable methods and materials has been done since then.

In 1987, Kodak-USA first successfully developed an electro-luminescent device by applying low voltage on a small molecule (Applied Physics letter, Volume 51, pp. 914, 1987). In 1990, the Cambridge University further developed an electro-luminescent device by using polymer as the light-emitting layer (Nature, Volume 347, pp. 539, 1990), and that has improved the practicality of the electro-luminescent device. Since then, numerous academic and industrial research studies based on electro-luminescent devices have been established.

Because an electro-luminescent device, which is able to luminesce under a low driving voltage, possesses a wide visual angle up to about 160°, is capable of displaying full color, and has a response short time, it possibly will become the next-generation flat panel color display. Since the development on the electro-luminescent device is nearly complete, applying the electro-luminescent device on applications including small-size display panels, outdoor display panels, and monitors is expected.

Recently, the prototype of a full-color organic electro-luminescent device utilizing small molecules has been made through development of materials. However, since the spin-coating process for coating the polymer solution layer cannot precisely define the locations of pixels of different colors, the development of an organic electro-luminescent device polymer is unrealized.

Of the principles of displaying full-color images on an organic electro-luminescent device, there are two main techniques are currently available: the direct-type full-color displaying technique, and the indirect-type full-color displaying technique. By using the direct-type full-color displaying technique, an OEL device displays colors through different pixels respectively, wherein each of the pixels is made to emit one of the pre-determined colors. On the other hand, an OEL device that applies the indirect-type full-color displaying technique colors images through a additional component such as a color filter or a color conversion layer located over the light-emitting layer.

Figure 1:
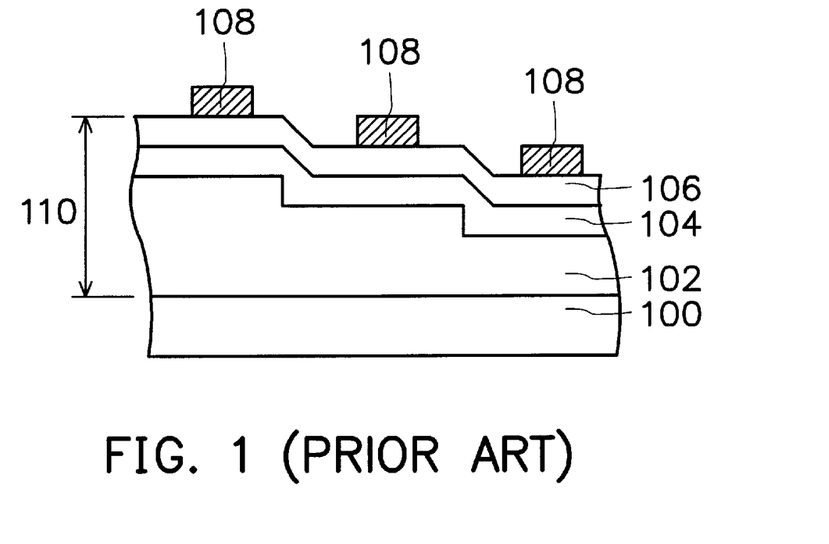
FIG. 1 is a schematic cross-sectional view showing a conventional full-color OEL device that consists of micro-cavities.
Figure 2:
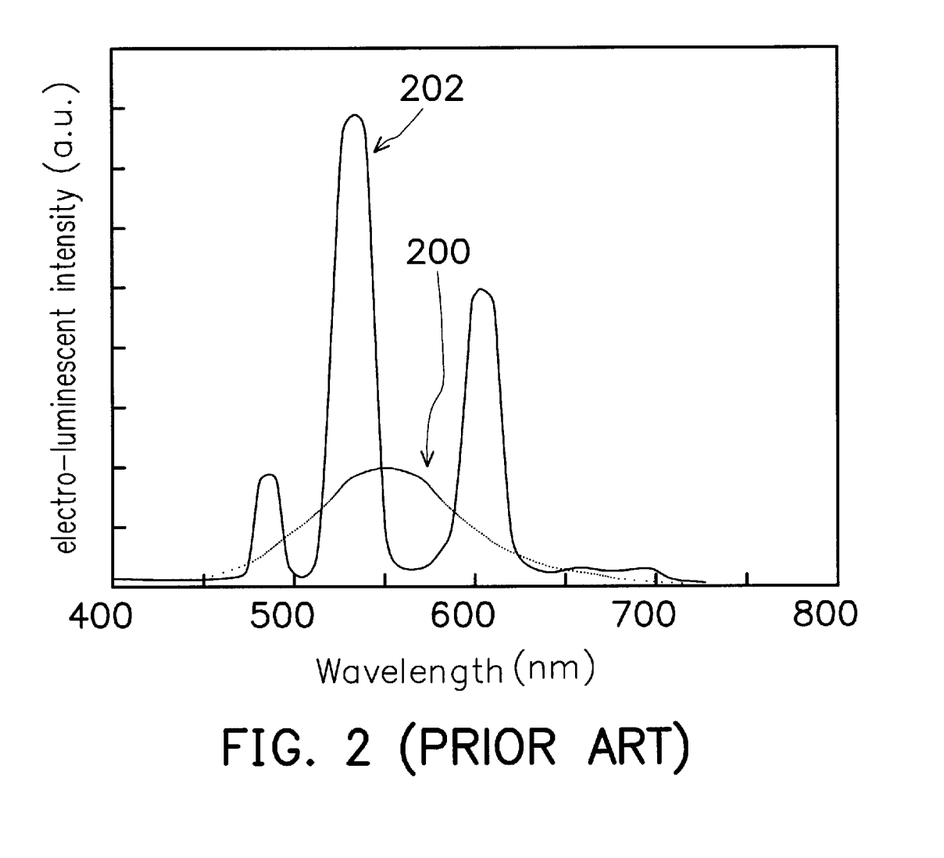
FIG. 2 is an experimental plot showing the spectrum of a conventional full-color OEL device shown in FIG. 1 and a similar conventional OEL device that does not contains micro-cavities.

There are various methods for fabricating an OEL device that applies the direct-type full-color displaying technique. Referring to FIG. 1, as described in ROC patent number 301,802, ROC patent number 318,284, and ROC patent number 318,966, micro-cavities of certain depths 110 are formed over a provided substrate 100 for displaying full-color images. The multi-thickness filler dielectric mirror 102 on the substrate 100 works as a quater-wave stack. The summation on the thickness of an indium tin oxide (ITO) layer 104 and a light-emitting layer 106 together with the local thickness of the multi-thickness filler dielectric mirror 102 constructs the depths of the micro-cavities. According to optical interference occurring within the micro-cavities, the electro-luminescent (EL) spectrum of an OEL device is changed through defining the depths of the micro-cavities. A metal layer 108 is formed on the foregoing structure and used as an electrode. The EL spectrum obtained from OEL devices of different structures is shown in FIG. 2. EL spectrum 200 is obtained from a non-cavity OEL device, and EL spectrum 202 is obtained from a multimode-cavity OEL device that contains peaks at several wavelengths. By precisely defining the depths of micro-cavities, an EL spectrum containing peaks at desired wavelengths, such as a red, green, and blue, can be obtained. However, the fabrication process of the foregoing structure requires very advanced technologies, thus the product is not cost competitive.

Figure 3:
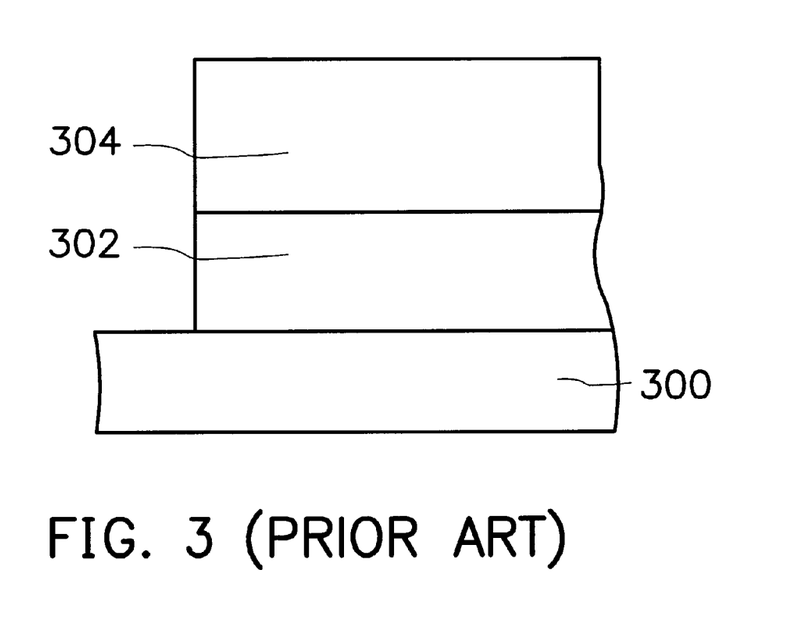
FIG. 3 is a schematic cross-sectional view showing a conventional full-color OEL device of a stacking method.

In ROC patent number 294,842, a stacking method is provided for fabricating a direct-type full-color OEL device. As shown in FIG. 3, a blue-light OEL device 302 and a red-light OEL device 304 are stacked on a substrate 300. Every pixel on the display panel formed by this method is capable of displaying either blue or red light, or both. By applying the foregoing method, a full-color display panel consisting of stacked red-light device, green-light device, and blue light OEL device can be fabricated. Since all OEL devices have to be precisely aligned by pixels, this increases the difficulty of the method. Furthermore, the electrode layers between the OEL devices degrade the intensities of the emitted light.

Figure 4:
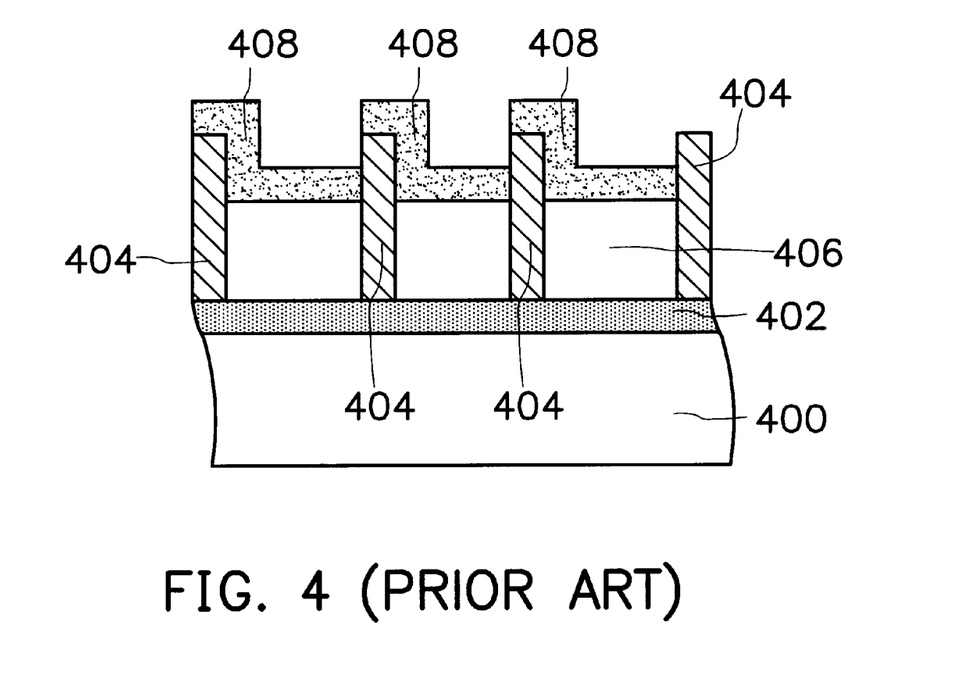
FIG. 4 is a schematic cross-sectional view showing a conventional full-color OEL device of an X-Y addressing method.

A method for fabricating a direct-type full-color OEL device that uses X-Y addressing pattern is shown in FIG. 4. As provided in U.S. Pat. Nos. 5,294,869 and 5,294,870, the method includes forming vertical shadow mask 404 on an ITO layer 402 over a substrate 400, and filling OEL materials 406 into the spaces partitioned by the vertical shadow mask 404. Then, an electrode layer 408 is formed by evaporation with a tilted angle on the filled OEL materials as a part of the driving circuit. The partitioned spaces containing the filled OEL materials 406 for emitting light of different wavelengths act as pixels. By filling proper OEL materials, a display panel consisting of such pixels is able to display full-color images under the operation of a driving circuit. Because the OEL materials are filled into the partitioned spaces by performing several deposition process, the fabricating cost is relatively high. In addition, since the OEL materials can only be filled into the partition spaces through deposition processes, the foregoing method is not suitable for polymer electro-luminescent device layers, which needs to be spin-coated onto the substrate.

Figure 5A:
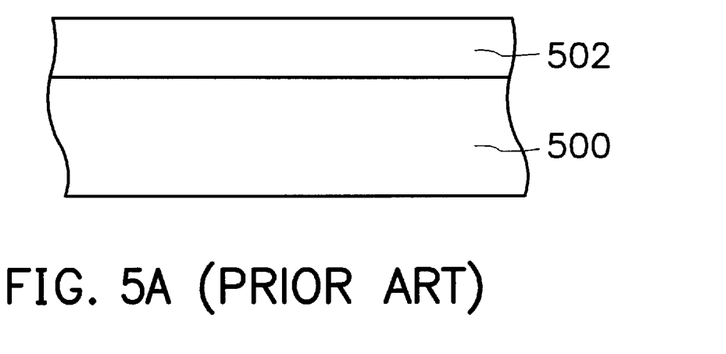
FIGS. 5A through 5F are schematic cross-sectional views showing a conventional photo-bleaching method for fabricating a full-color OEL device.
Figure 5B:
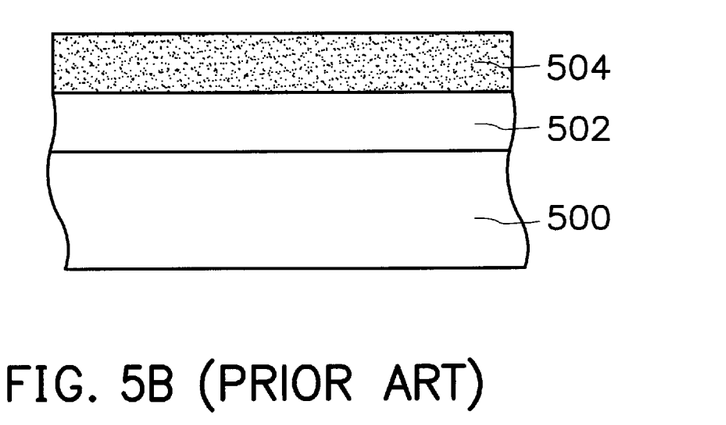
Figure 5C:
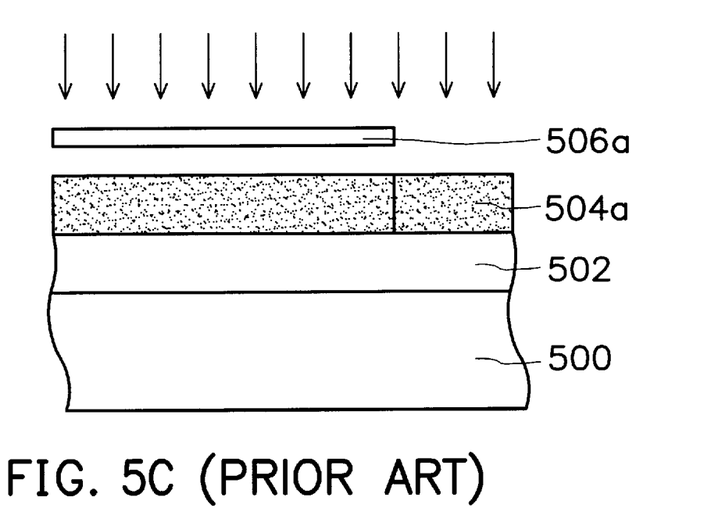
Figure 5D:
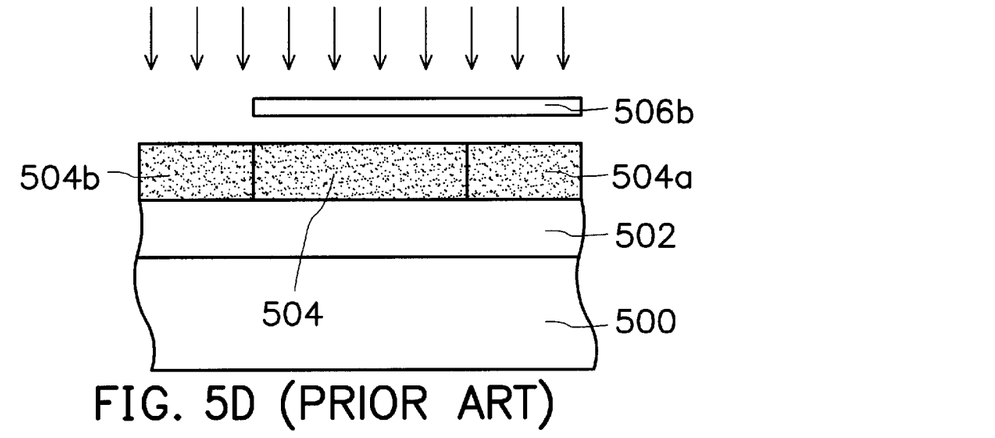
Figure 5E:
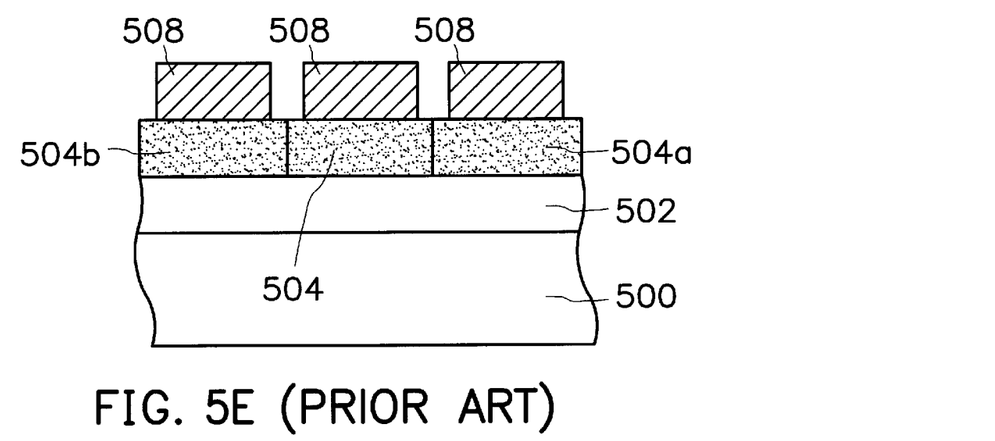
Figure 5F:
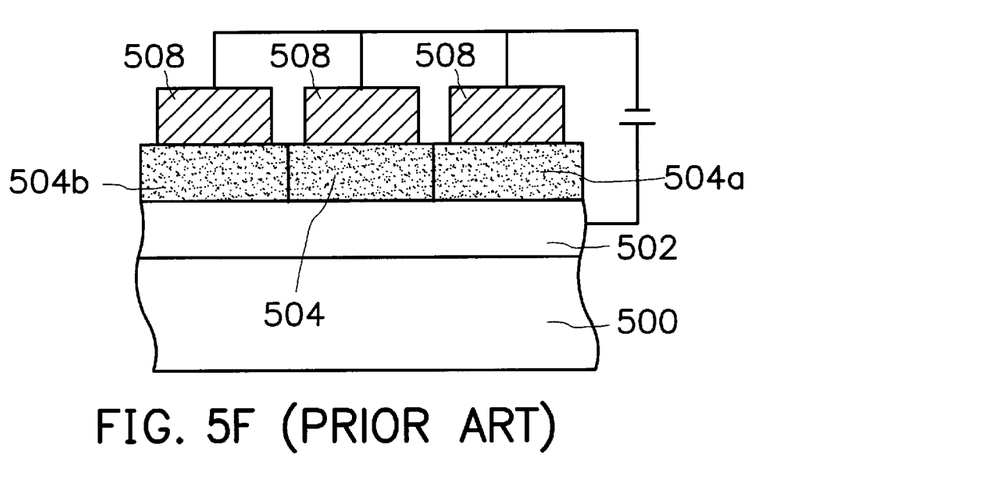

In FIGS. 5A through 5E, developed by Professor Kido, a method for fabricating a direct-type full-color OEL device that applies photo-bleaching technique is illustrated. Referring to FIG. 5A, an ITO layer 502 is first formed on substrate 500. As shown in FIG. 5B, a dye-doped layer 504 for emitting red light is coated on the ITO layer 502. Then, referring to FIGS. 5C and 5D, by applying masks, 506a and 506b, and external irradiation, the conjugated structures of the energy gaps in desired portions of the dye-doped layer 504, 504a and 504b, are restructured, and then enlarged. The portions of the dye-doped layer 504, 504a and 504b, are able to emit green light and blue light by changing the energy gap. The electrode layer 508 is then formed on the pixels 504, 504a, and 504b. The electrode layer 508 and the ITO layer are connected to a driving circuit as shown in FIG. 5F. Since the energy gaps of the dye-doped material are directly related to the quality of displayed colors, the destruction of conjugation of exposing the dye-doped material under external irradiation will reduce electro-luminescent efficiency and increase the turn-on voltage. So, currently, this method is not practical.

A method provided by Yang Yang using an ink-jet printer, instead of a spin-coater, to coat polymer is able to reduce the waste of polymer in the fabrication process (Science, Volume 279, p.p. 1135, 1998). However, this new method still has some problems to be overcome, such as developing a better solution and resolving the clogging problem occurring at the ink-jet head.

Figure 6:
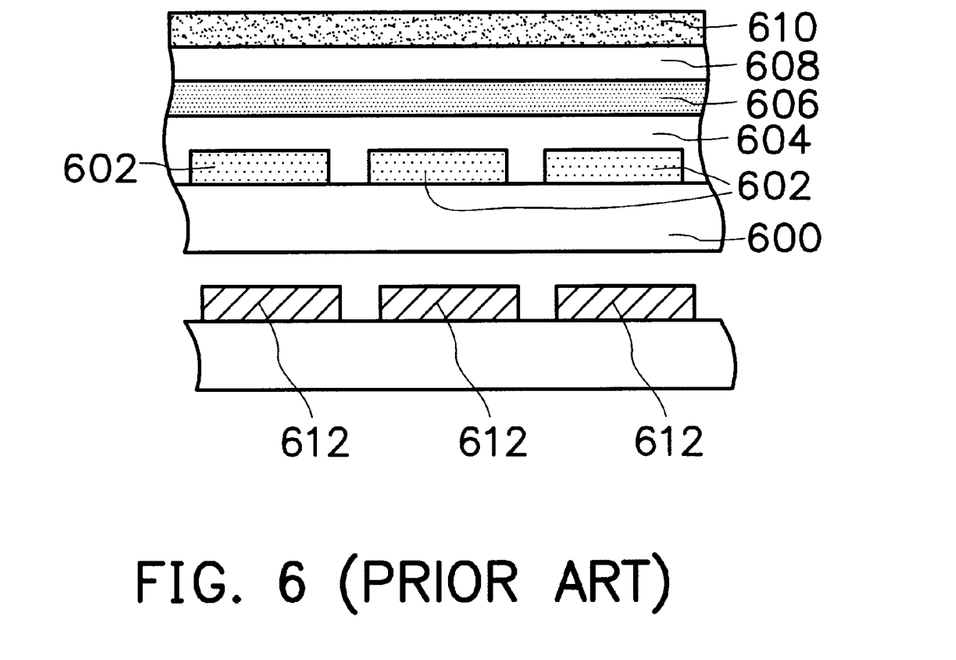
FIG. 6 is a schematic cross-sectional view showing a conventional indirect-type full-color OEL device that contains a color filter.

Some methods have also developed for fabricating an indirect-type full-color OEL device. For example, a method developed by TDK Inc. that adds a color filter for displaying full-color images is shown in FIG. 6. Referring to FIG. 6, a red-green-blue color filter 612 is placed on the pixels of a conventional white-light OEL device. The provided conventional white-light OEL device consists of substrate 600, ITO layer 602, hole transport layer 604, white-light emitting layer 609, electron transport layer 608, and electrode layer 610. Since a color filter has to be attached on the white-light OEL device in order to display color images, the luminance of the color display device is inevitably suppressed.

Figure 7:
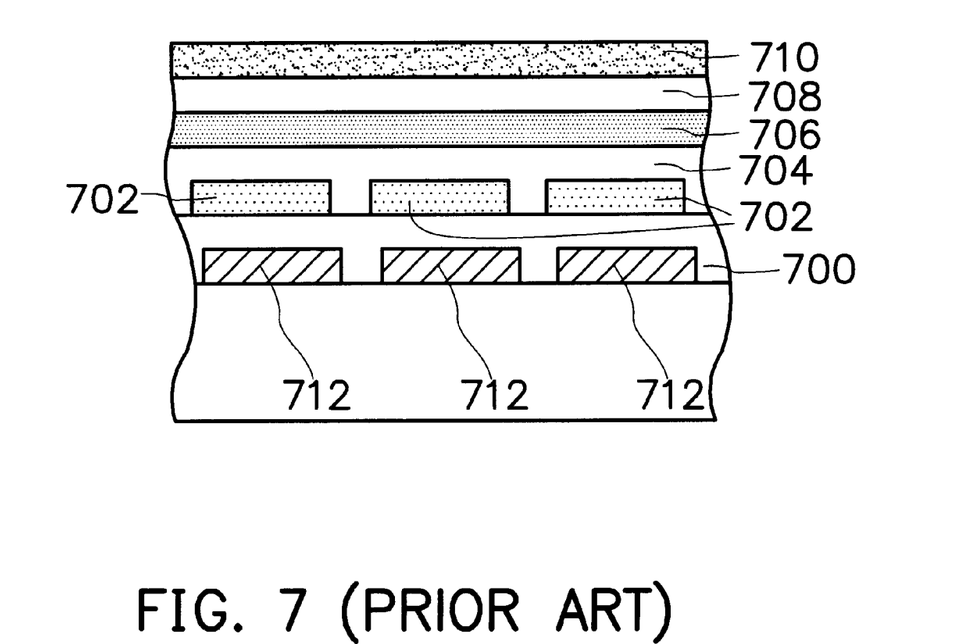
FIG. 7 is a schematic cross-sectional view showing a conventional indirect-type full-color OEL device that contains a color conversion layer.

Referring to FIG. 7, another method introduced by Idemitsu Kosan for fabricating an indirect-type full-color OEL device includes forming a color conversion layer 712 on a conventional blue-light OEL device. Similar to the previous method shown in FIG. 6, with the presence of a color conversion layer 712, the blue light emitted from a conventional blue-light OEL device is converted into a pixel set consisting of red, green, and blue lights. The conventional OEL device consists of a glass substrate 700, an ITO layer 702, a hole transport layer 704, a blue-light emitting layer 706, an electron transport layer 708, and an electrode layer 710. Even though the OEL device is capable of displaying color images with an additional color conversion layer 712, the presence of an additional color conversion layer 712 degrades the luminance of the device.

SUMMARY OF THE INVENTION

It is therefore an objective of the present invention to provide a method for forming a full-color organic electro-luminescent (OEL) device that defines the colors emitted from pixels by generating conjugation-coupling structures and changing the energy gaps within the luminescent material.

It is another an objective of the present invention to provide a method for fabricating a full-color OEL device that is suitable for fabrication by forming a spin-coated polymer emitting layer, or by depositing a small molecule emitting layer.

In accordance with the foregoing and other objectives of the present invention, the method of the invention starts with forming a blue-light emitting layer on a substrate, a glass substrate and an indium tin oxide (ITO) layer formed thereon. Irradiating predetermined portions of the blue-light emitting layer with certain light sources generates conjugation-coupling structures within the blue-light emitting layer. The conjugation-coupling structures narrow the energy gap of the material, forming pixels that emit light of different colors on the blue-light emitting layer. An electrode layer is then formed on the corresponding pixels on the redefined blue-light emitting layer, wherein the electrode layer is further covered by a protection layer. During operation of the full-color OEL device of the invention, a driving voltage is applied on the ITO layer, the anode, and the electrode layer, the cathode.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The invention provides a new method for fabricating a full-color organic electro-luminescent (OEL) device through generating conjugation-coupling structure within the light-emitting materials to partially change the energy gap of the light-emitting material, as shown in FIGS. 8A through 8F, 9, 10, and 11.

Figure 8A:
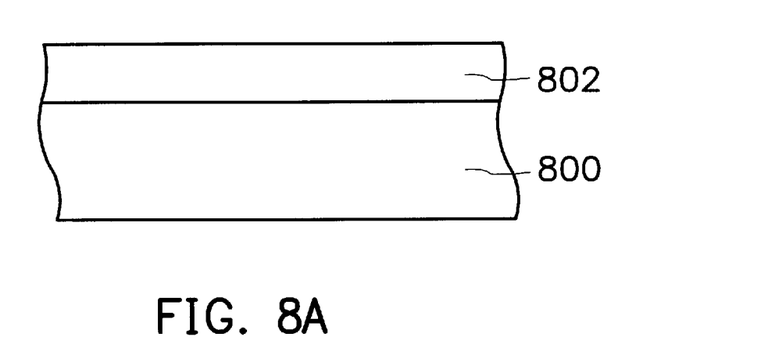
FIGS. 8A through 8F are schematic cross-sectional views showing the method of a preferred embodiment according to the invention for fabricating a full-color OEL device.
Figure 8B:
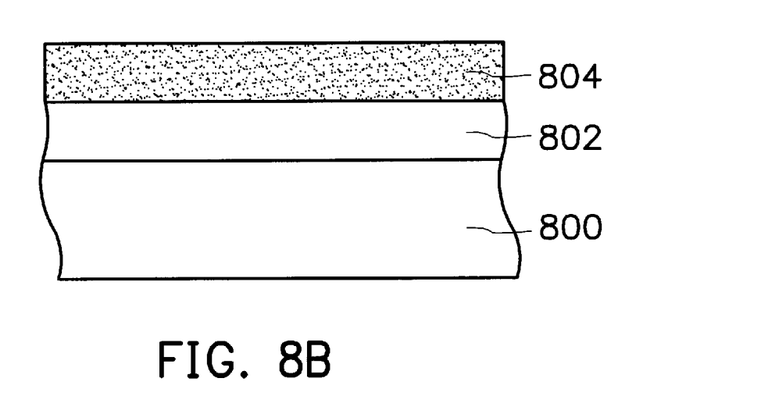
Figure 9:
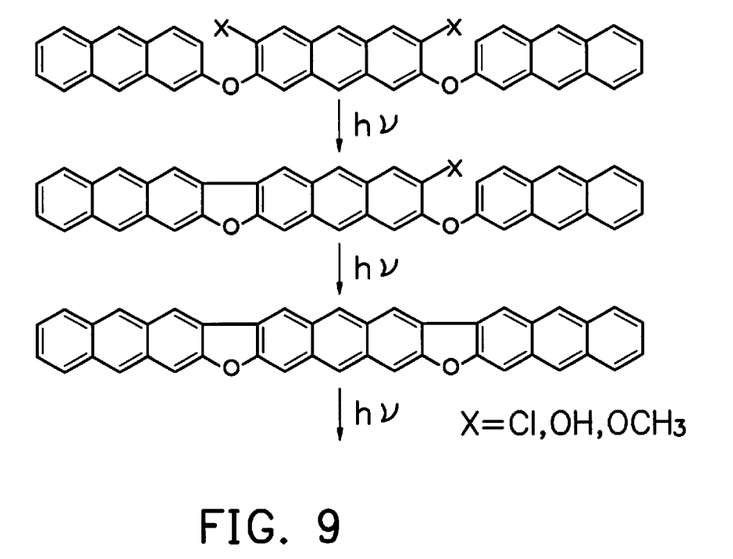
FIG. 9 is a schematic diagram showing the optical reaction of oxy-anthracene trimer.
Figure 10:
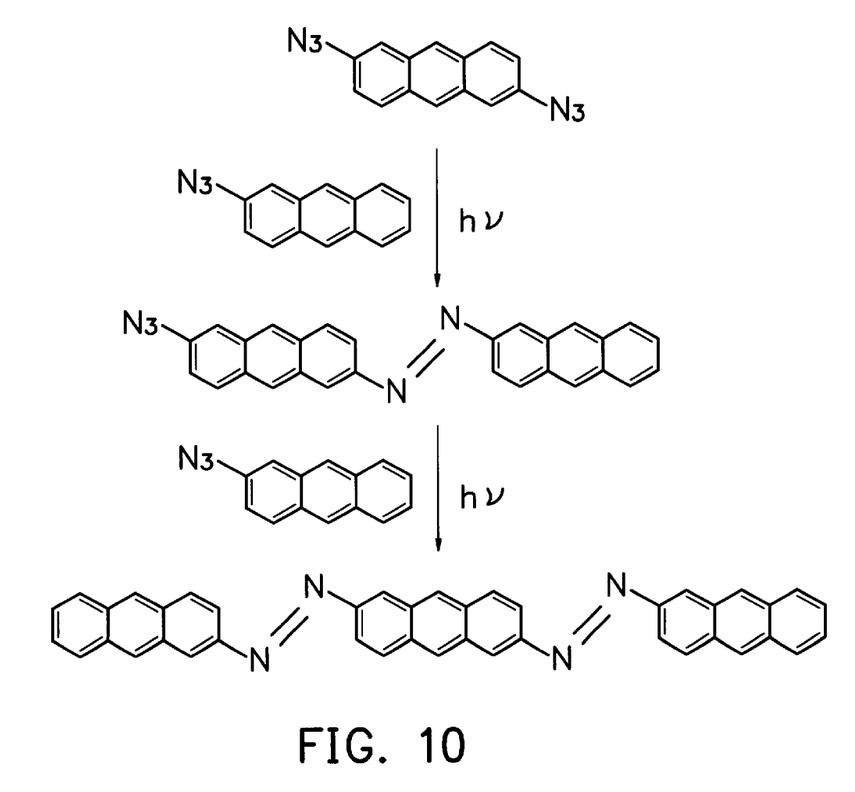
FIG. 10 is a schematic diagram showing the optical reaction of di-2,6-azide anthracene.
Figure 11:
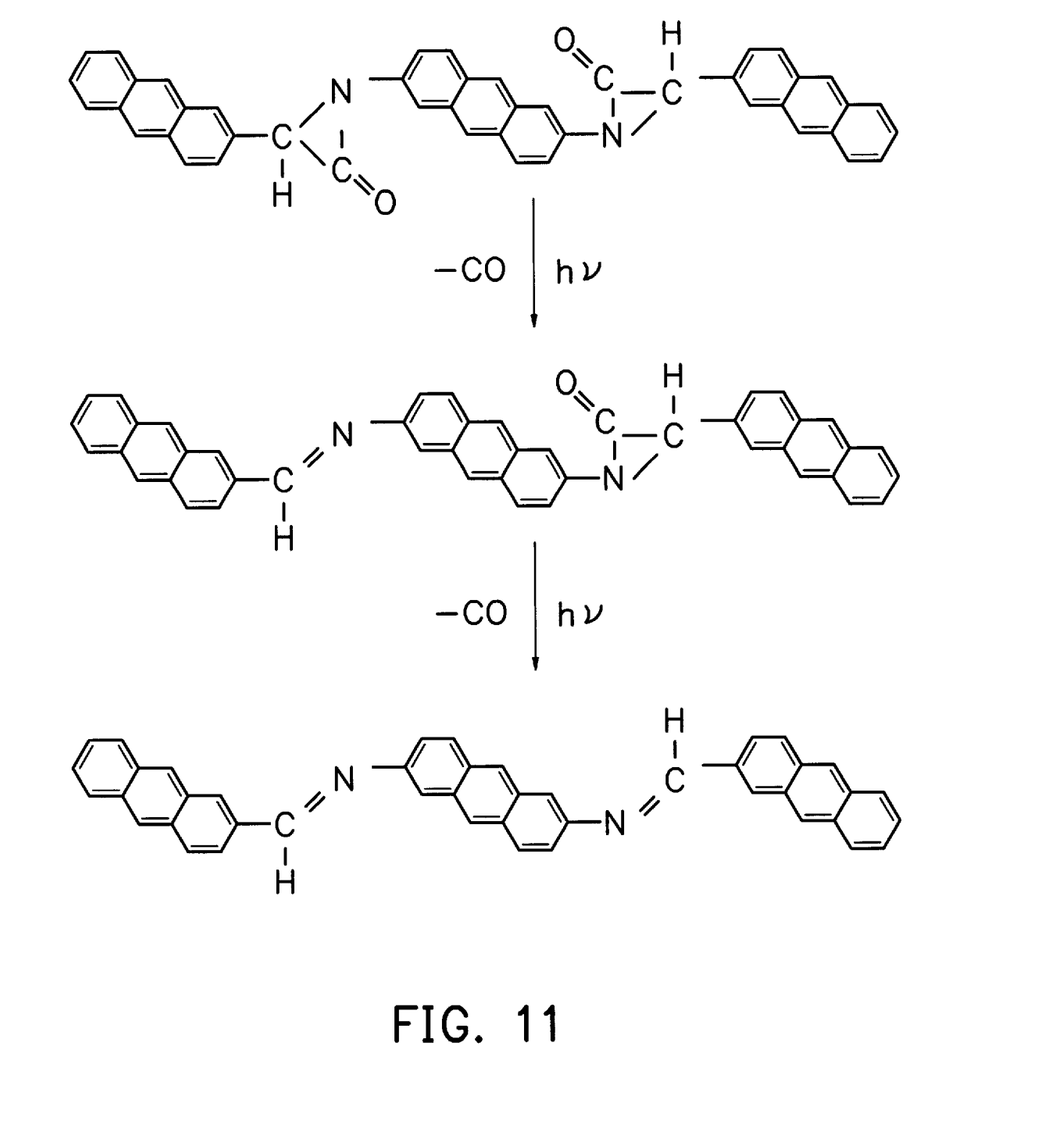
FIG. 11 is a schematic diagram showing the optical reaction of lactam-anthracene trimer.

Referring to FIGS. 8A and 8B, a blue-light emitting layer 804 is formed on a clean indium-tin-oxide glass, wherein the indium-tin-oxide glass consists of an indium tin oxide (ITO) layer 802 and a glass substrate 800. The blue-light emitting layer 804 is laid on the ITO glass by performing a process such as deposition or spin-coating. Since the blue-light emitting layer 804 is irradiated by ultraviolet rays, electron beam, or laser beam in a follow-up process to generate conjugation-coupling structure having narrower energy gaps, the selected material has to be optically sensitive to at least one of the foregoing light sources. The material of the blue-light emitting layer 804 containing blue-light energy gaps can be a compound of anthracene chromophore, such as oxy-anthracene trimer, di-2,6-azide anthracene, or lactam-anthracene trimer. Other materials of the similar property can be also selected. The chemical structures and optical-chemical reactions of the foregoing materials are shown in FIGS. 9 through 11, respectively.

Figure 8C:
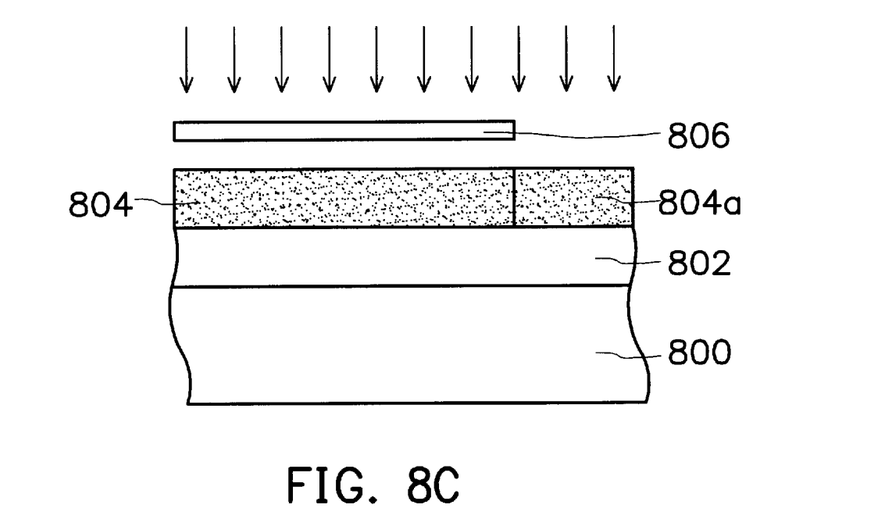
Figure 8D:
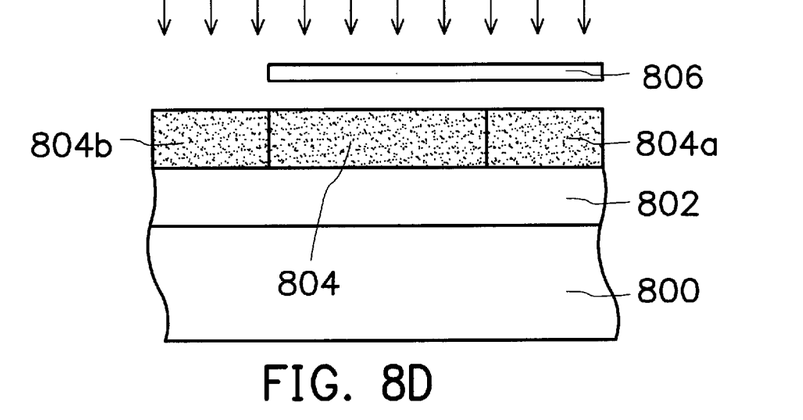

Referring next to FIGS. 8C and 8D, the blue-light emitting layer 804 is partially redefined into portions 804, 804a, and 804b, which are pixels emitting light of different colors. For a light-emitting material, the color of the emitted light is directly related to the energy gap of the material, that is, the color of the emitted light can be tuned or adjusted by changing the energy gap of the material. One characteristics of the light-emitting material of the invention is the conjugation-coupling structures, which have narrower energy gaps, can be generated by exposing the materials of the invention under the irradiation of a certain light source. Hence, the energy gap of blue-light emitting material 804 can be narrowed by the conjugation-coupling structures generated through performing an irradiation process on partial surface of the blue-light emitting material. Since the energy gap of the light-emitting material can be determined by the amount of irradiation, pixels that emit light of different colors can therefore formed by controlling the intensity of irradiation.

As shown in FIG. 8C, a mask 806 that exposes a portion of the light-emitting layer 804 for forming a first pixel 804a is placed over the light-emitting layer 804 while a first irradiation process is performed. After that, a second irradiation process is performed to expose another portion of the light-emitting material for forming a second pixel 804b, as shown in FIG. 8D. The non-irradiated portion of the light-emitting material is reserved for a third pixel 804. The regions of first pixel 804a and the second pixel 804b are exposed under different amounts of irradiation. By precisely determining the time and intensity of irradiation, the pixel formed by a lighter amount of irradiation emits green light, and the pixel formed by a heavier amount of irradiation emits red light. The light source of irradiation can be ultraviolet rays, electron beam, or computer-controlled laser beams.

Figure 8E:
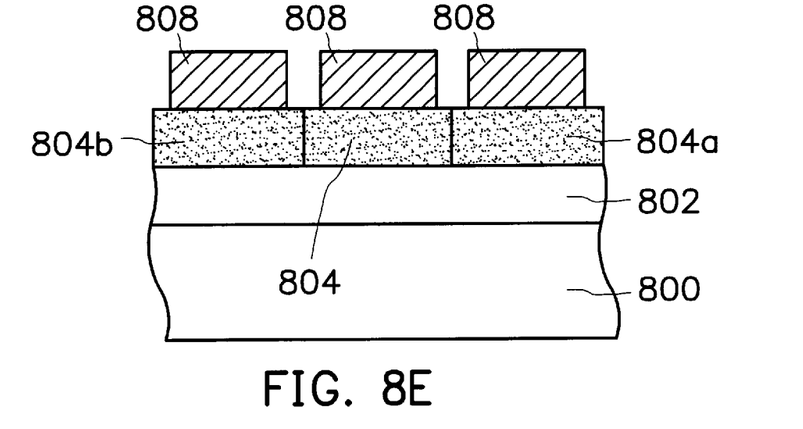

Referring next to FIG. 8E, an electrode layer 808, and then, a protection layer (not shown in figure) are formed on the pixels 804, 804a, and 804b, wherein the position of the electrode layer 808 is corresponding to the pixels 804, 804a, and 804b underneath. The formation of the electrode layer 808 and the protection layer (not shown in figure) includes a deposition process.

Figure 8F:
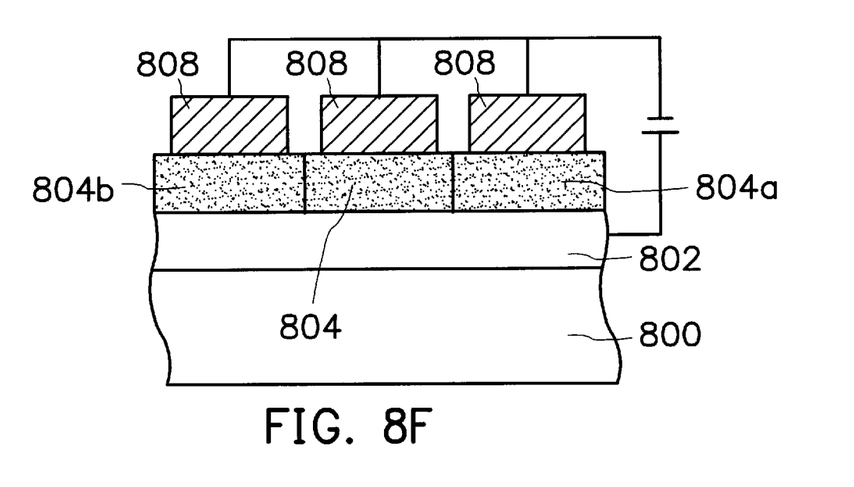

Referring to FIG. 8F, a driving voltage is applied on the full-color OEL device of the invention by wiring the electrode layer 808 as a cathode, and in the meantime, wiring the ITO layer 802 as an anode. Through a proper driving voltage, the OEL device can be used to display full-color images.

According to the foregoing, the method of the invention for fabricating a full-color OEL devices includes at least the following advantages:

1. The method of the invention applies the direct-type full-color displaying technique, so that the steps and cost for forming a color filter or a color conversion layer are omitted. Also, the method of the invention defines pixels displaying different colors by performing irradiation process, instead of forming any complicated structures, such as micro-cavities or several stacked light-emitting layers, thus the fabrication cost is reduced by the described fabrication process.
2. The method of the invention defines pixels emitting different colors through an irradiation process instead of forming a color filter or a color conversion layer. Therefore, the intensity of luminescence is not suppressed.
3. The method of the invention defines pixels emitting different colors through an irradiation process. Hence, the resolution of a OEL device can be raised.
4. Because the light source employed in the method of the invention includes a computer-controlled laser, various patterns and texts can be input by a computer, and then scanned onto the OEL device.
5. The method of the invention is applicable for both a spin-coated polymer OEL device and a deposited small molecule OEL device.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating a full-color organic electroluminescent device over a substrate, the method comprising steps of:

forming an emitting layer on the substrate, wherein the emitting layer emits blue light while a driving voltage is applied;

performing a first irradiation process to expose a first portion of the emitting layer for forming a first pixel on the substrate;

performing a second irradiation process to expose a second portion of the emitting layer for forming a second pixel on the substrate;

forming a electrode layer on the pixels.

2. The method of claim 1, wherein the substrate comprises:

a glass substrate; and an indium-tin oxide (ITO) layer formed on the glass substrate.

3. The method of claim 1, wherein the step of forming an emitting layer includes spin-coating.

4. The method of claim 1, wherein the step of forming an emitting layer includes deposition.

5. The method of claim 1, wherein the emitting layer is one selected from a group consisting of oxy-anthracene trimer, di-2,6-azide anthracene, and lactam-anthracene trimer.

6. The method of claim 1, wherein the emitting layer includes a solution of a material and a polymer, wherein the material has a blue-light energy gap.

7. The method of claim 6, wherein the material is one selected from a group consisting of oxy-anthracene trimer, di-2,6-azide anthracene, and lactam-anthracene trimer.

8. The method of claim 1, wherein the irradiation source includes ultraviolet rays.

9. The method of claim 1, wherein the irradiation source includes electron beam.

10. The method of claim 1, wherein the irradiation source includes laser beam.

11. The method of claim 1, wherein the first pixel emits red light.

12. The method of claim 11, wherein the second pixel emits green light.

13. The method of claim 1, wherein the first pixel emits green light.

14. The method of claim 13, wherein the second pixel emits red light.

15. The method of claim 1, wherein the step of forming an electrode layer includes deposition.

16. The method of claim 1 further comprises a step of forming a protection layer to cover the electrode layer.

17. The method of claim 16, wherein the step of forming a protection layer includes deposition.

* * * * *